(12) United States Patent
Nishino et al.

(10) Patent No.: US 10,091,886 B2
(45) Date of Patent: Oct. 2, 2018

(54) COMPONENT BUILT-IN MULTILAYER BOARD

(71) Applicant: Murata Manufacturing Co., Ltd., Nagaokakyo-shi, Kyoto-fu (JP)

(72) Inventors: Kosuke Nishino, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/298,366

(22) Filed: Oct. 20, 2016

(65) Prior Publication Data

US 2017/0042033 A1  Feb. 9, 2017

Related U.S. Application Data

(63) Continuation of application No. PCT/JP2015/065985, filed on Jun. 3, 2015.

(30) Foreign Application Priority Data

Jun. 18, 2014  (JP) .................................. 2014-124872

(51) Int. Cl.
*H05K 1/18* (2006.01)
*H05K 1/02* (2006.01)
(Continued)

(52) U.S. Cl.
CPC .............. *H05K 1/185* (2013.01); *H03H 7/01* (2013.01); *H05K 1/0298* (2013.01);
(Continued)

(58) Field of Classification Search
CPC .... H05K 1/185; H05K 1/0298; H05K 1/0313; H05K 1/09; H05K 1/115; H05K 1/165;
(Continued)

(56) References Cited

U.S. PATENT DOCUMENTS 5,401,688 A * 3/1995 Yamaji ................ H01L 23/3164
156/196
2004/0183192 A1  9/2004 Otsuka et al.
(Continued)

FOREIGN PATENT DOCUMENTS

JP  05-211275 A  8/1993
JP  2004-235523 A  8/2004
(Continued)

OTHER PUBLICATIONS

Official Communication issued in International Patent Application No. PCT/JP2015/065985, dated Aug. 11, 2015.

*Primary Examiner* — Michael P McFadden
(74) *Attorney, Agent, or Firm* — Keating & Bennett, LLP

(57) ABSTRACT

In an LC composite component, a chip capacitor is built in a multilayer substrate including base material layers made of a thermoplastic resin. The number of the base material layers in a portion overlapping the component as seen from a lamination direction is equal to the number of the base material layers in a portion around the component as seen from the lamination direction. Wiring patterns that adjust the thickness of the multilayer substrate are provided around the chip capacitor as seen from the lamination direction, and on principal surfaces of the base material layers, so as to surround the chip capacitor.

16 Claims, 7 Drawing Sheets

(51) Int. Cl.
    *H05K 1/03*     (2006.01)
    *H05K 1/09*     (2006.01)
    *H05K 1/11*     (2006.01)
    *H05K 1/16*     (2006.01)
    *H05K 3/46*     (2006.01)
    *H03H 7/01*     (2006.01)
    *H03H 1/00*     (2006.01)

(52) U.S. Cl.
    CPC ............. *H05K 1/0313* (2013.01); *H05K 1/09* (2013.01); *H05K 1/115* (2013.01); *H05K 1/165* (2013.01); *H05K 1/186* (2013.01); *H05K 3/4652* (2013.01); *H03H 2001/0085* (2013.01); *H05K 3/4632* (2013.01); *H05K 2201/0129* (2013.01); *H05K 2201/0141* (2013.01); *H05K 2201/10015* (2013.01)

(58) Field of Classification Search
    CPC .... H05K 1/186; H05K 3/4652; H05K 3/4632; H05K 2201/0129; H05K 2201/0141; H05K 2201/10015; H03H 7/01
    USPC .......................................................... 361/762
    See application file for complete search history.

(56) References Cited

U.S. PATENT DOCUMENTS

| | | |
|---|---|---|
| 2006/0240664 A1 | 10/2006 | Wada et al. |
| 2009/0237900 A1 | 9/2009 | Origuchi et al. |
| 2012/0212919 A1* | 8/2012 | Mano ..................... H05K 1/185 361/782 |
| 2014/0043196 A1* | 2/2014 | Gouchi .................... H01Q 7/06 343/788 |

FOREIGN PATENT DOCUMENTS

| | | |
|---|---|---|
| JP | 2005-072229 A | 3/2005 |
| JP | 2006-287008 A | 10/2006 |
| JP | 2009-260318 A | 11/2009 |

* cited by examiner

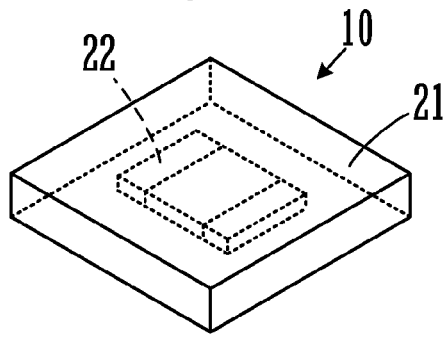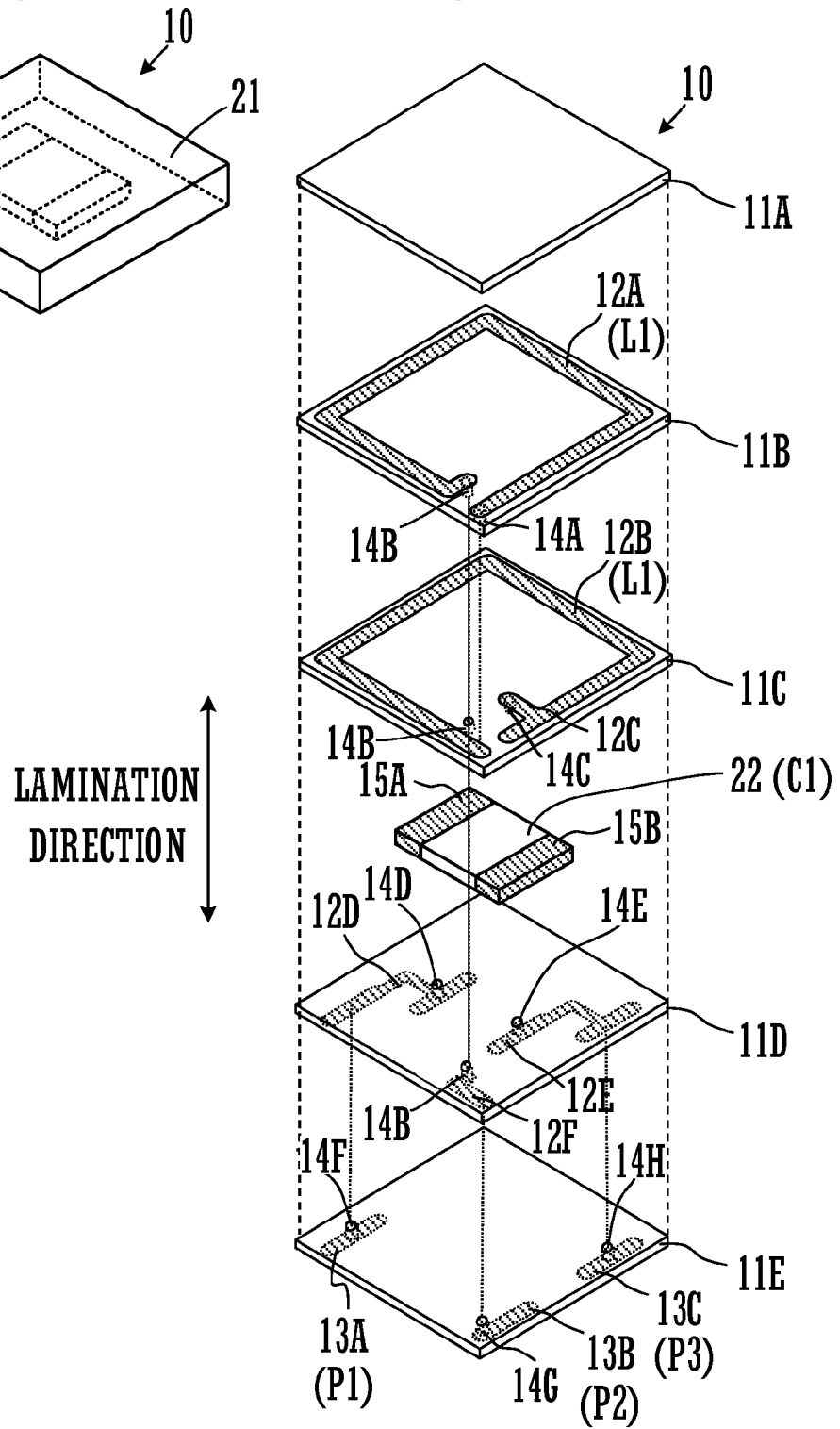

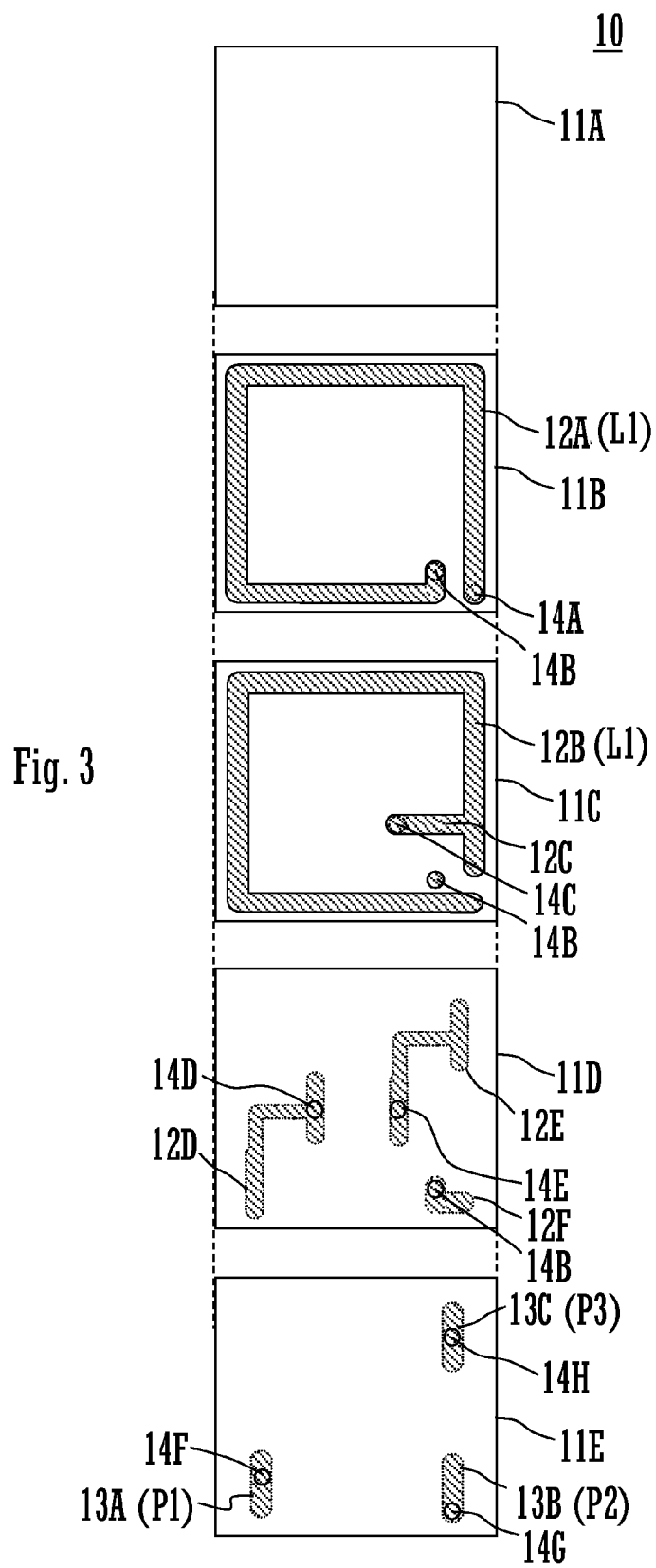

COMPONENT BUILT-IN MULTILAYER BOARD

CROSS REFERENCE TO RELATED APPLICATIONS

This application claims the benefit of priority to Japanese Patent Application 2014-124872 filed Jun. 18, 2014 and is a Continuation Application of PCT/JP2015/065985 filed on Jun. 3, 2015. The entire contents of each application are hereby incorporated herein by reference.

BACKGROUND OF THE INVENTION

1. Field of the Invention

The present invention relates to a component built-in multilayer board in which a component is built in a multilayer substrate including laminated base material layers.

2. Description of the Related Art

An example of a component built-in wiring board is disclosed in Japanese Unexamined Patent Application Publication No. 2009-260318. In the component built-in wiring board, a built-in IC chip is housed in a housing hole provided in a core substrate. The gap between a wall surface of the housing hole and the IC chip is filled with a resin filler. Built-up layers are provided on both principal surfaces of the core substrate.

In the component built-in wiring board disclosed in Japanese Unexamined Patent Application Publication No. 2009-260318, it is necessary to form the housing hole in the core substrate in order to house the IC chip in the core substrate. That is, the manufacturing process for the component built-in wiring board is complicated as compared to the case where no component is built in.

SUMMARY OF THE INVENTION

Preferred embodiments of the present invention provide a component built-in multilayer board that is manufactured without performing a step of forming a cavity.

According to a preferred embodiment of the present invention, a component built-in multilayer board includes a component that is built in a multilayer substrate including a plurality of laminated base material layers made of a thermoplastic resin. In the multilayer substrate, the number of the laminated base material layers in a portion overlapping the component as seen from a lamination direction is equal to the number of the base material layers in a portion around the component as seen from the lamination direction, and a thickness adjustment member that adjusts a thickness of the multilayer substrate is provided on a principal surface of the base material layer and around the component as seen from the lamination direction, so as to surround the component.

With this configuration, in the multilayer substrate, the number of the base material layers in the portion overlapping the component as seen from the lamination direction is equal to the number of the base material layers in the portion around the component as seen from the lamination direction. That is, in a manufacturing process for the component built-in multilayer board, a cavity for housing the component is not formed. Thus, in a portion at which the component is located as seen from the lamination direction, the component built-in multilayer board is thicker than in the case where a cavity is formed. Meanwhile, since the thickness adjustment member is provided in the portion around the component, the component built-in multilayer board is also thicker in the portion around the component, than in the case where a thickness adjustment member is not provided. That is, even when a cavity for housing the component is not provided, the difference in thickness between the portion of the multilayer substrate overlapping the component and the portion thereof around the component, as seen from the lamination direction, is decreased by the thickness adjustment member. Thus, it is easy to hot-press thermoplastic resin base materials stacked with the component interposed therebetween, and to manufacture the component built-in multilayer board. As a result, the component built-in multilayer board is obtained without performing a step of forming a cavity.

In addition, since the thickness adjustment member is provided in the portion around the component, when the stacked thermoplastic resin base materials are hot-pressed, the resin is held in position by the thickness adjustment member in the portion around the component, and is less likely to flow. Thus, the positional accuracy of the component is increased.

In a component built-in multilayer board according to a preferred embodiment of the present invention, the thickness adjustment member is preferably provided on the principal surface of each of the plurality of base material layers. In this configuration, since a plurality of the thickness adjustment members are provided along the lamination direction, the effects of various preferred embodiments of the present invention are further improved.

In a component built-in multilayer board according to a preferred embodiment of the present invention, in the lamination direction, a sum of thicknesses of the thickness adjustment members is preferably equal or substantially equal to the thickness of the component. In this configuration, in the thermoplastic resin base materials stacked with the component interposed therebetween, the thickness of the portion overlapping the component as seen from the lamination direction is equal or substantially equal to the thickness of the portion around the component as seen from the lamination direction. Thus, hot-pressing of the thermoplastic resin base materials stacked with the component interposed therebetween in order to manufacture the component built-in multilayer board is facilitated.

In a component built-in multilayer board according to a preferred embodiment of the present invention, both principal surfaces of the multilayer substrate are preferably flat or substantially flat. In a preferred embodiment of the present invention, as seen from the above, it is possible to obtain a component built-in multilayer board in which both principal surfaces are flat or substantially flat, even without performing a step of forming a cavity.

In a component built-in multilayer board according to a preferred embodiment of the present invention, the thickness adjustment member is preferably a conductor pattern. In this configuration, it is possible to form the thickness adjustment member by patterning a metal foil attached to the thermoplastic resin base material.

In a component built-in multilayer board according to a preferred embodiment of the present invention, the thickness adjustment member preferably defines at least a portion of a wiring pattern forming a circuit. In this configuration, since the wiring pattern is also used as the thickness adjustment member, it is not necessary to provide an additional thickness adjustment member.

In a component built-in multilayer board according to a preferred embodiment of the present invention, the thickness adjustment member is preferably a coil pattern. In this configuration, it is not necessary to provide an additional thickness adjustment member, and it is possible to obtain a thickness adjustment member that surrounds the component.

In a component built-in multilayer board according to a preferred embodiment of the present invention, the thickness adjustment member is preferably provided within a range where the component is disposed, in the lamination direction. In this configuration, since the thickness adjustment member is provided near a side surface of the component, the resin is further less likely to flow in the portion around the component during hot-pressing. Thus, it is possible to further increase the positional accuracy of the component.

In a component built-in multilayer board according to a preferred embodiment of the present invention, the thickness adjustment member is preferably provided in the portion around the component as seen from the lamination direction, and on each of the base material layers from the base material layer located at one side in the lamination direction of the component to the base material layer located at the other side in the lamination direction of the component. In this configuration, during hot-pressing, the resin is further less likely to flow in the portion around the component. Thus, it is possible to further increase the positional accuracy of the component.

According to various preferred embodiments of the present invention, as described above, it is possible to manufacture component built-in multilayer boards without performing a step of forming a cavity.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

BRIEF DESCRIPTION OF THE DRAWINGS

FIG. 2A is an external perspective view of the LC composite component according to the first preferred embodiment of the present invention.

FIG. 2B is an exploded perspective view of the LC composite component according to the first preferred embodiment of the present invention.

FIG. 3 is an exploded plan view of the LC composite component according to the first preferred embodiment of the present invention.

DETAILED DESCRIPTION OF THE PREFERRED EMBODIMENTS

First Preferred Embodiment

Figure 1:
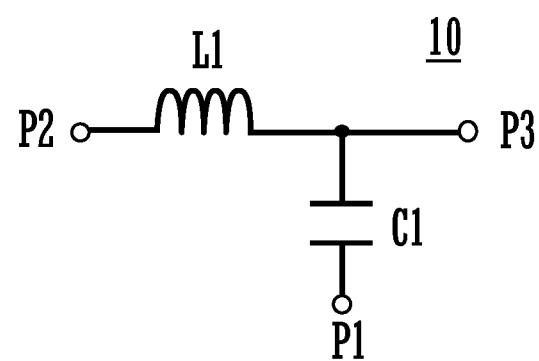
FIG. 1 is an equivalent circuit diagram of an LC composite component according to a first preferred embodiment of the present invention.

An LC composite component 10 according to a first preferred embodiment of the present invention will be described with reference to the drawings. The LC composite component 10 is a non-limiting example of a component built-in multilayer board according to a preferred embodiment of the present invention. FIG. 1 is an equivalent circuit diagram of the LC composite component 10. The LC composite component 10 includes an inductor L1, a capacitor C1, and terminals P1 to P3. The terminal P2 is connected to the terminal P3 via the inductor L1. A connection point between the inductor L1 and the terminal P3 is connected to the terminal P1 via the capacitor C1. With the terminal P1 being used as a ground connection terminal and the terminal P2 and the terminal P3 being used as input and output terminals, the LC composite component 10 defines and functions as a low pass filter.

FIG. 2A is an external perspective view of the LC composite component 10. FIG. 2B is an exploded perspective view of the LC composite component 10. FIG. 3 is an exploded plan view of the LC composite component 10. In FIG. 3, the illustration of a chip capacitor 22 is omitted. In the LC composite component 10, the chip capacitor 22 is built in a multilayer substrate 21 including a plurality of laminated base material layers 11A to 11E made of a thermoplastic resin. The chip capacitor 22 is preferably made of a material (e.g., a metal, a ceramic material, or other suitable material) that does not flow at a temperature at which the thermoplastic resin is pressure-bonded (e.g., in the case of using a liquid crystal polymer (LCP), at approximately the plasticizing temperature of the LCP (at about 240 degrees to about 300 degrees)). The chip capacitor 22 is an example of a component of a preferred embodiment of the present invention.

The multilayer substrate 21 includes base material layers 11A to 11E that are preferably rectangular or substantially rectangular in a plan view and laminated in this order from above. The chip capacitor 22 is disposed on the upper surface of the base material layer 11D to define the capacitor C1. Loop-shaped wiring pattern 12A and wiring pattern 12B corresponding to the inductor L1 are provided on the upper surfaces of the base material layers 11B and 11C, respectively. Wiring patterns 13A to 13C corresponding to the terminals P1 to P3 are provided on the lower surface of the base material layer 11E. With the chip capacitor 22, the wiring pattern 12A, the wiring pattern 12B, and the terminals P1 to P3 being connected as described later, a low pass filter is provided in the LC composite component 10.

In the multilayer substrate 21, the number of the laminated base material layers in a portion overlapping the chip capacitor 22 as seen from the lamination direction is equal to the number of the laminated base material layers in a portion around the chip capacitor 22 as seen from the lamination direction. In other words, an opening for housing the chip capacitor 22 is not formed in the base material layers 11A to 11E. The wiring pattern 12A and the wiring pattern 12B that adjusts the thickness of the multilayer substrate 21 are provided on principal surfaces of the base material layers 11B and 11C, respectively, and around the chip capacitor 22 as seen from the lamination direction, so as to surround the chip capacitor 22. The wiring patterns 12A and 12B function as the inductor L1 as described above, and also adjust the thickness of the multilayer substrate 21 as described later. The wiring patterns 12A and 12B, which are an example of a thickness adjustment member, are provided on principal surfaces of a plurality of base material layers, define at least a portion of a wiring pattern of a circuit, are conductor patterns, and are coil patterns. A wiring pattern provided on the principal surface of each base material layer does not flow at a temperature at which the thermoplastic resin is pressure-bonded.

The chip capacitor 22 preferably has a rectangular or substantially rectangular flat plate shape, and is disposed at a central portion of the base material layer 11D in a plan view such that a principal surface thereof faces in the lamination direction. Outer electrodes 15A and 15B are provided on both end portions, in a longitudinal direction, of the chip capacitor 22, respectively. The wiring pattern 12A extends along the entirety of the edge of the base material layer 11B. The wiring pattern 12A includes a first end portion and a second end portion provided at a corner of the base material layer 11B and close to each other. The first end portion of the wiring pattern 12A extends inward from the edge of the base material layer 11B.

The wiring pattern 12B extends along the entirety of the edge of the base material layer 11C. The wiring pattern 12B includes a first end portion and a second end portion provided at a corner of the base material layer 11C and close to each other. Near the first end portion of the wiring pattern 12B, a wiring pattern 12C extends from the wiring pattern 12B. The wiring pattern 12C extends so as to overlap the outer electrode 15B on the chip capacitor 22 in a plan view. The second end portion of the wiring pattern 12A and the second end portion of the wiring pattern 12B are connected to each other via an inter-layer connection conductor 14A that penetrates the base material layer 11B in the lamination direction.

The wiring pattern 13A is provided at the edge of the base material layer 11E. The wiring patterns 13B and 13C are aligned along the edge opposite to the edge at which the wiring pattern 13A is provided. Wiring patterns 12D to 12F are provided on the lower surface of the base material layer 11D. The wiring pattern 12D extends so as to overlap the wiring pattern 13A and the outer electrode 15A on the chip capacitor 22 in a plan view. The wiring pattern 12E extends so as to overlap the wiring pattern 13C and the outer electrode 15B on the chip capacitor 22 in a plan view. The wiring pattern 12F extends so as to overlap the first end portion of the wiring pattern 12A and the wiring pattern 13B in a plan view.

The outer electrode 15A on the chip capacitor 22 is connected to the wiring pattern 13A via an inter-layer connection conductor 14D that penetrates the base material layer 11D, the wiring pattern 12D, and an inter-layer connection conductor 14F that penetrates the base material layer 11E. The first end portion of the wiring pattern 12A is connected to the wiring pattern 13B via an inter-layer connection conductor 14B that penetrates the base material layers 11B to 11D, the wiring pattern 12F, and an inter-layer connection conductor 14G that penetrates the base material layer 11E.

The outer electrode 15B on the chip capacitor 22 is connected to the wiring pattern 12C via an inter-layer connection conductor 14C that penetrates the base material layer 11C. Furthermore, the outer electrode 15B on the chip capacitor 22 is connected to the wiring pattern 13C via an inter-layer connection conductor 14E that penetrates the base material layer 11D, the wiring pattern 12E, and an inter-layer connection conductor 14H that penetrates the base material layer 11E.

The base material layers 11A to 11E are preferably made of a thermoplastic resin, such as a liquid crystal polymer (LCP), for example, as described above. The wiring patterns 12A to 12F and the wiring patterns 13A to 13C are preferably made of a copper foil or other suitable material. The inter-layer connection conductors 14A to 14H are preferably made of a conductive paste with which via holes are filled and solidified. As described above, the chip capacitor 22 is preferably made of a material that does not flow at the temperature at which the thermoplastic resin of the base material layers 11A to 11E is pressure-bonded.

Figure 4:
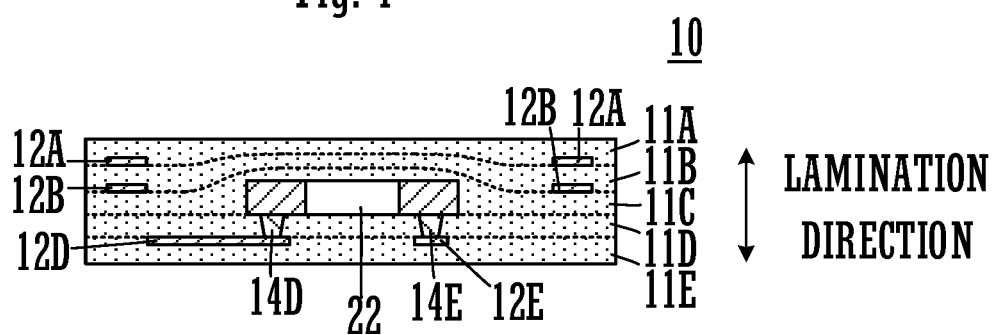
FIG. 4 is a cross-sectional view of the LC composite component according to the first preferred embodiment of the present invention.

FIG. 4 is a cross-sectional view of the LC composite component 10. The base material layers 11B and 11C are displaced upward from another portion in the portion overlapping the chip capacitor 22 in a plan view. The base material layers 11A and 11C are thin in the portion overlapping the chip capacitor 22 in a plan view. The chip capacitor 22 is disposed in a space that occurs by the base material layers 11B and 11C being displaced upward and the base material layers 11A to 11C being made thin.

The LC composite component 10 is thicker in the portion around the chip capacitor 22 as seen in a plan view, than where the wiring patterns 12A and 12B are not formed, due to the thicknesses of the wiring patterns 12A and 12B. The wiring patterns 12A and 12B are arranged near a side surface of the chip capacitor 22. The chip capacitor 22 and the wiring pattern 12B are disposed such that side surfaces (end surfaces) thereof face each other. That is, the wiring pattern 12B is arranged within the range where the chip capacitor 22 is disposed, in the lamination direction. Both principal surfaces of the LC composite component 10, that is, both principal surfaces of the multilayer substrate 21, are preferably flat or substantially flat.

Figure 5A:
FIGS. 5A to 5E are cross-sectional views showing a manufacturing method for the LC composite component according to the first preferred embodiment of the present invention.

FIGS. 5A to 5E are cross-sectional views showing a manufacturing method for the LC composite component 10. The structure of the LC composite component 10 that is not shown in FIGS. 5A to 5E is formed in parallel or substantially in parallel with the steps shown in FIGS. 5A to 5E and by the same steps as those shown in FIGS. 5A to 5E. First, as shown in FIG. 5A, a base material 25D including a metal foil attached on the entirety of a single surface thereof is prepared, and the metal foil is patterned by etching or other suitable method, thus forming the wiring patterns 12D and 12E. The base material 25D is a thermoplastic resin base material formed from a liquid crystal polymer (LCP) or other suitable resin.

Figure 5B:
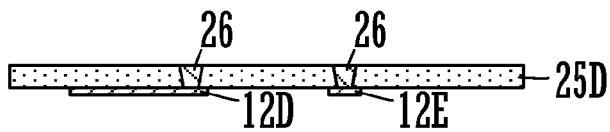

Next, as shown in FIG. 5B, a via hole that penetrates the base material 25D but that does not penetrate the wiring pattern 12D is formed by laser beam machining at a position at which the inter-layer connection conductor 14D (see FIG. 2B) is to be formed. A via hole that penetrates the base material 25D but that does not penetrate the wiring pattern 12E is formed at a position at which the inter-layer connection conductor 14E is to be formed. These via holes are filled with a conductive paste 26.

Figure 5C:
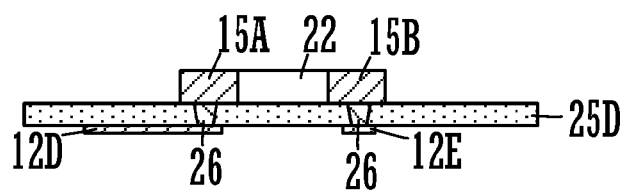

Next, as shown in FIG. 5C, the chip capacitor 22 is disposed on the upper surface of the base material 25D such that the outer electrode 15A and the outer electrode 15B overlap the conductive paste 26 in a plan view. Then, the base material 25D including the chip capacitor 22 disposed thereon is pressurized while being heated (i.e., is hot-pressed), thus the chip capacitor 22 is thermally pressure-bonded to the base material 25D.

Figure 5D:
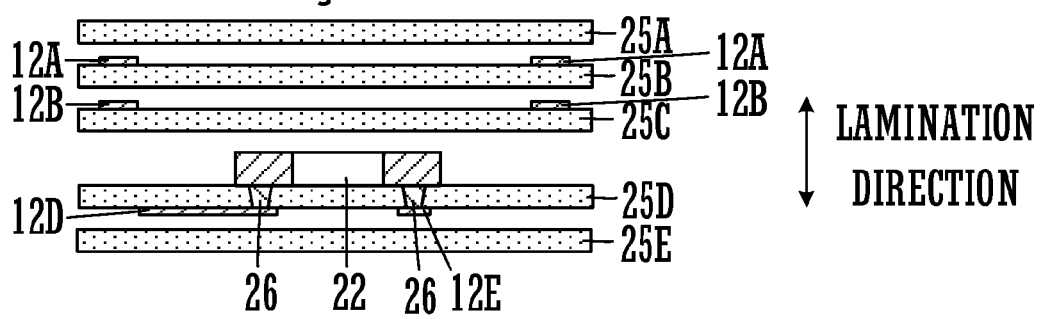

Next, as shown in FIG. 5D, the base materials 25A to 25E are stacked in this order from above. At this time, of the principal surfaces of the base materials 25B and 25C, the side at which the wiring patterns are formed faces upward, and, of the principal surfaces of the base materials 25D and 25E, the side at which the wiring patterns are formed faces downward. In the base materials 25B to 25E, wiring patterns and via holes filled with a conductive paste are formed in a predetermined arrangement by the same steps as those shown in FIGS. 5A and 5B. An opening for housing the chip capacitor 22 is not formed in the base materials 25B and 25C.

Figure 5E:
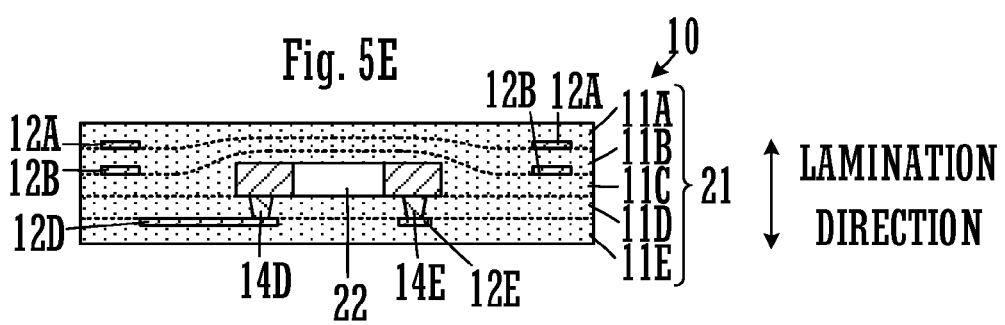

Next, as shown in FIG. 5E, the stacked base materials 25A to 25E are pressurized while being heated, thus the base materials 25A to 25E are thermally pressure-bonded to each other. Accordingly, the LC composite component 10 including the chip capacitor 22 built in the multilayer substrate 21 is completed. A cavity formed by openings in the base materials being connected to each other is not formed in the multilayer substrate 21.

In the first preferred embodiment, as described above, in the manufacturing process for the LC composite component 10, a cavity for housing the chip capacitor 22 is not formed. Thus, in the portion in which the chip capacitor 22 is located in a plan view, the LC composite component 10 is thicker than in the case where a cavity is formed. Meanwhile, the wiring patterns 12A and 12B are formed in the portion around the chip capacitor 22 in a plan view. Thus, the LC composite component 10 is also thicker in the portion around the chip capacitor 22 in a plan view, than in the case where the wiring patterns 12A and 12B are not formed.

That is, even when a cavity for housing the chip capacitor 22 is not provided, the difference in thickness between the portion of the multilayer substrate 21 overlapping the chip capacitor 22 and the portion thereof around the chip capacitor 22 in a plan view is decreased, due to the wiring patterns 12A and 12B. As a result, hot-pressing the stacked base materials 25A to 25E such that both principal surfaces of the LC composite component are flat or substantially flat is facilitated. Therefore, without performing a step of forming a cavity, it is possible to form the LC composite component 10 of which both principal surfaces are flat or substantially flat.

In addition, the wiring patterns 12A and 12B are formed near the side surface of the chip capacitor 22. Thus, during hot-pressing, near the side surface of the chip capacitor 22, the resin is held and less likely to flow. Therefore, it is possible to increase the positional accuracy of the chip capacitor 22.

Second Preferred Embodiment

Figure 6A:
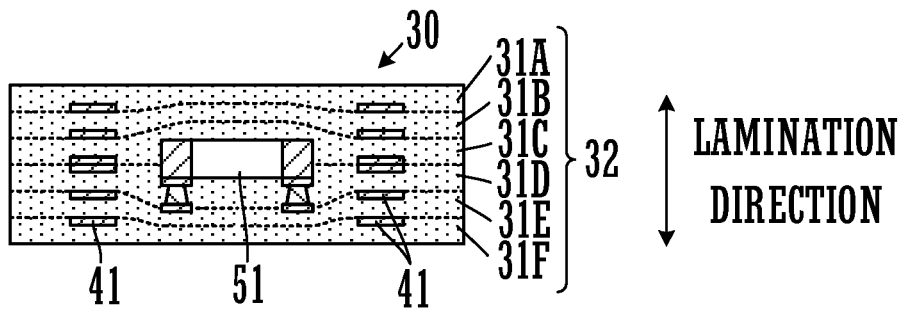
FIGS. 6A to 6C are a cross-sectional view, an exploded cross-sectional view, and a plan view, each showing a portion of a component built-in multilayer board according to a second preferred embodiment of the present invention.
Figure 6B:
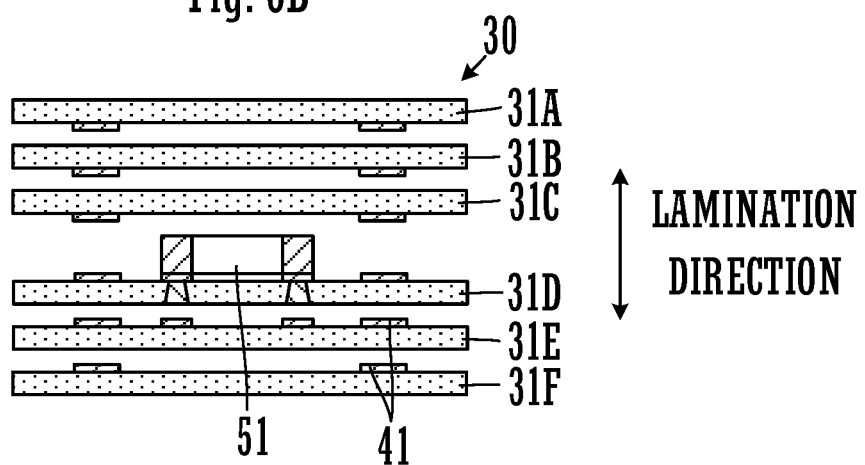
Figure 6C:
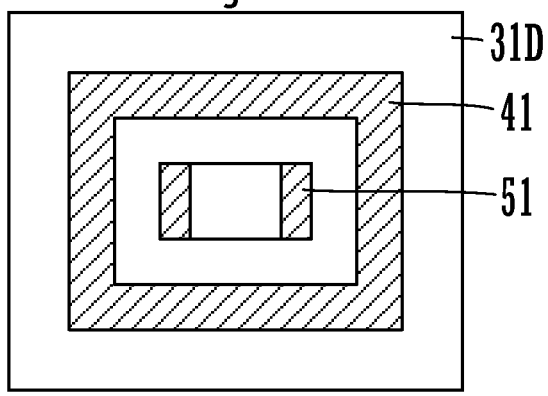

A component built-in multilayer board 30 according to a second preferred embodiment of the present invention will be described with reference to the drawings. FIG. 6A is a cross-sectional view showing a portion of the component built-in multilayer board 30. FIG. 6B is an exploded cross-sectional view showing a portion of the component built-in multilayer board 30. FIG. 6C is a plan view showing a portion of a base material layer 31D.

In the component built-in multilayer board 30, a component 51 made of a material that does not flow at a temperature at which a thermoplastic resin is pressure-bonded is built in a multilayer substrate 32 including a plurality of laminated base material layers 31A to 31F preferably made of the thermoplastic resin. In the multilayer substrate 32, the number of the laminated base material layers in a portion overlapping the component as seen from the lamination direction is equal to that in a portion around the component as seen from the lamination direction. An adjustment pattern 41 that adjusts the thickness of the multilayer substrate 32 is provided on a principal surface of each of the base material layers 31A to 31F and around the component 51 as seen from the lamination direction, so as to surround the component 51.

In the component built-in multilayer board 30, the base material layers 31A to 31F are laminated in this order from above. The component 51 is disposed between the base material layer 31C and the base material layer 31D. The adjustment patterns 41 are provided on the lower surfaces of the base material layers 31A to 31C and the upper surfaces of the base material layers 31D to 31F. Each adjustment pattern 41 preferably has a frame shape and is made of a copper foil, for example. The adjustment pattern 41 provided on the base material layer 31A is located above the upper surface of the component 51. The adjustment pattern 41 provided on the base material layer 31F is located below the lower surface of the component 51. That is, the adjustment patterns 41 are provided in the portion around the component 51 as seen from the lamination direction and on the respective base material layers 31A to 31F from the base material layer 31A located at one side in the lamination direction of the component 51 to the base material layer 31F located at the other side in the lamination direction of the component 51. In the lamination direction, the sum of the thicknesses of the adjustment patterns 41 is preferably equal or substantially equal to the thickness of the component 51.

In the second preferred embodiment, as described above, the sum of the thicknesses of the adjustment patterns 41 is preferably equal or substantially equal to the thickness of the component 51. Thus, in the base materials laminated with the component 51 interposed therebetween, the thickness of the portion overlapping the component 51 as seen from the lamination direction is equal or substantially equal to the thickness of the portion around the component 51 as seen from the lamination direction. Therefore, hot-pressing the stacked base materials such that both principal surfaces of the component built-in multilayer board 30 are flat or substantially flat is facilitated.

Figure 7A:
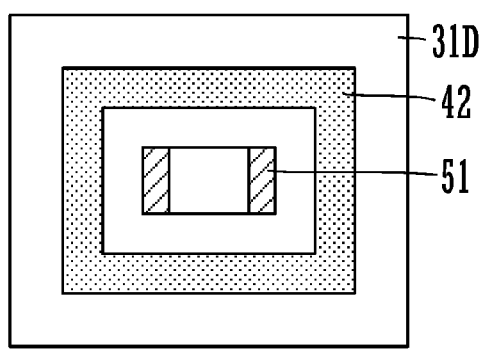
FIGS. 7A to 7D are plan views of base material layers according to modifications of the second preferred embodiment of the present invention.

FIGS. 7A to 7D are plan views of base material layers 31D according to modifications of the second preferred embodiment of the present invention. Hereinafter, the differences from the component built-in multilayer board 30 in the modifications of the second preferred embodiment will be described. In the first modification, as shown in FIG. 7A, a frame-shaped adjustment pattern 42 made of a nonconductor, such as a resin, is provided on a principal surface of the base material layer 31D so as to surround the component 51 in a plan view. An adjustment pattern that is the same or substantially the same as that provided on the base material layer 31D is also provided on each of the other base material layers. The same applies to the other modifications of the second preferred embodiment.

Figure 7B:
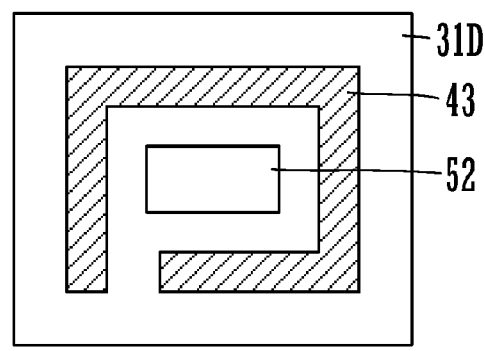

In the second modification, as shown in FIG. 7B, a ceramic ferrite core 52 is disposed on a principal surface of the base material layer 31D. The ceramic ferrite core 52 is an example of the component of a preferred embodiment of the present invention. An adjustment pattern 43 preferably made of a copper foil, for example, is provided on the principal surface of the base material layer 31D so as to surround the ceramic ferrite core 52 in a plan view. The adjustment pattern 43 is preferably a coil pattern.

Figure 7C:
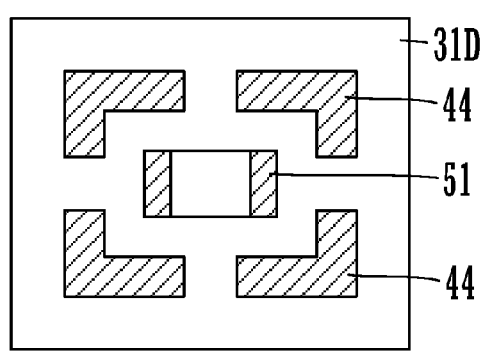

In the third modification, as shown in FIG. 7C, four adjustment patterns 44 are provided on a principal surface of the base material layer 31D. Each adjustment pattern 44 is configured such that side surfaces thereof face portions of side surfaces of the component 51 that form a corner. In other words, the adjustment patterns 44 have a shape obtained by a central portion in a longitudinal direction of each straight portion being removed from a frame-shaped adjustment pattern.

Figure 7D:
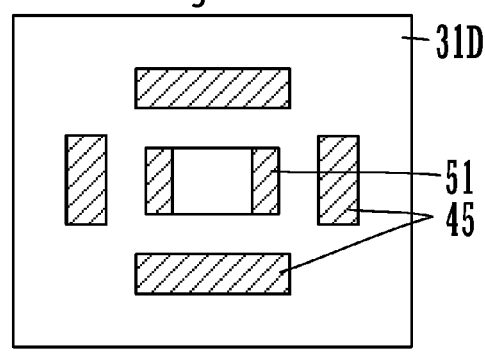

In the fourth modification, as shown in FIG. 7D, four adjustment patterns 45 are provided on a principal surface of the base material layer 31D. Each adjustment pattern 45 is configured such that a side surface thereof faces a side surface of the component 51. In other words, the adjustment patterns 45 have a shape obtained by corner portions being removed from a frame-shaped adjustment pattern.

Components built in the multilayer substrate according to various preferred embodiments of the present invention are not limited to the above preferred embodiments, and may be a member made of a material that does not flow at the temperature at which the thermoplastic resin of the multilayer substrate is thermally pressure-bonded, for example, a magnet (ferrite sintered body), and other suitable materials.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component built-in multilayer board comprising
a multilayer substrate including a plurality of laminated base material layers; and
a component built in the multilayer substrate; wherein
at least one of the base material layers is made of a thermoplastic resin;
at least one of the base material layers includes a bottom portion that is flush with the component and a top surface that is above the component;
in the multilayer substrate, a number of the laminated base material layers in a portion overlapping the component as seen from a lamination direction is equal to a number of the laminated base material layers in a portion around the component as seen from the lamination direction;
a thickness adjustment member that adjusts a thickness of the multilayer substrate is provided on a principal surface of at least one of the base material layers and around the component as seen from the lamination direction, so as to surround the component;
the multilayer substrate does not include an opening for housing the component; and
both principal surfaces of the multilayer substrate are flat or substantially flat.

2. The component built-in multilayer board according to claim 1, wherein the thickness adjustment member is provided on a principal surface of each of the plurality of base material layers.

3. The component built-in multilayer board according to claim 2, wherein, in the lamination direction, a sum of thicknesses of the thickness adjustment members is equal or substantially equal to a thickness of the component.

4. The component built-in multilayer board according to claim 1, wherein the thickness adjustment member includes a conductor pattern.

5. The component built-in multilayer board according to claim 4, wherein the thickness adjustment member defines at least a portion of a wiring pattern of a circuit.

6. The component built-in multilayer board according to claim 5, wherein the thickness adjustment member includes a coil pattern.

7. The component built-in multilayer board according to claim 1, wherein the thickness adjustment member is provided within a range where the component is disposed, in the lamination direction.

8. The component built-in multilayer board according to claim 1, wherein the thickness adjustment member is provided in the portion around the component as seen from the lamination direction, and on each of the base material layers from a base material layer located at one side in the lamination direction of the component to a base material layer located at another side in the lamination direction of the component opposite to the one side.

9. The component built-in multilayer board according to claim 1, wherein the thermoplastic resin is a liquid crystal polymer.

10. The component built-in multilayer board according to claim 1, wherein the component is a chip capacitor.

11. The component built-in multilayer board according to claim 1, wherein
the component built-in multilayer board is an LC composite component;
the component is a chip capacitor; and
the thickness adjustment member defines at least a portion of an inductor.

12. The component built-in multilayer board according to claim 1, wherein the thickness adjustment member has a frame shape.

13. The component built-in multilayer board according to claim 1, wherein the thickness adjustment member is made of copper foil.

14. The component built-in multilayer board according to claim 1, wherein the component has a rectangular or substantially rectangular flat plate shape, and is disposed at a central portion of one of the plurality of base material layers.

15. The component built-in multilayer board according to claim 1, wherein
the thickness adjustment member includes a plurality of adjustment patterns provided on respective ones of the plurality of base material layers; and
each of the plurality of adjustment patterns has a frame shape.

16. The component built-in multilayer board according to claim 1, wherein
the thickness adjustment member includes a plurality of wiring patterns provided on respective ones of the plurality of base material layers; and
the plurality of wiring members are connected to one another by inter-layer connection conductors.

* * * * *